(12) United States Patent
Yamae

(10) Patent No.: US 10,490,706 B2
(45) Date of Patent: Nov. 26, 2019

(54) LIGHTING DEVICE

(71) Applicant: PANASONIC INTELLECTUAL PROPERTY MANAGEMENT CO., LTD., Osaka (JP)

(72) Inventor: Kazuyuki Yamae, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/135,400

(22) Filed: Sep. 19, 2018

(65) Prior Publication Data

US 2019/0097092 A1    Mar. 28, 2019

(30) Foreign Application Priority Data

Sep. 25, 2017    (JP) ................... 2017-184011

(51) Int. Cl.
*F21V 7/04* (2006.01)
*H01L 33/50* (2010.01)
*F21V 8/00* (2006.01)

(52) U.S. Cl.
CPC ............. *H01L 33/50* (2013.01); *G02B 6/001* (2013.01); *G02B 6/0006* (2013.01); *G02B 6/0026* (2013.01); *G02B 6/0031* (2013.01); *G02B 6/0071* (2013.01)

(58) Field of Classification Search
None
See application file for complete search history.

(56) References Cited

U.S. PATENT DOCUMENTS

2007/0122103 A1    5/2007    Yamazaki et al.
2013/0033901 A1    2/2013    Nishitani et al.

FOREIGN PATENT DOCUMENTS

| JP | 2005-267928 | 9/2005 |
| JP | 2007-155820 | 6/2007 |
| JP | 2013-30493 | 2/2013 |
| JP | 2014-17060 | 1/2014 |
| JP | 2015-141786 | 8/2015 |

*Primary Examiner* — Vip Patel
(74) *Attorney, Agent, or Firm* — Greenblum & Bernstein, P.L.C.

(57) ABSTRACT

A lighting device includes a laser light source that emits laser light, a wavelength converter that converts a wavelength of the laser light and emits wavelength-converted light, and a linear light guide that is elongated and guides the wavelength-converted light emitted by the wavelength converter and introduced through a longitudinal end surface. The linear light guide includes a lateral surface that emits the wavelength-converted light guided by the linear light guide. A proportion of the wavelength-converted light emitted by the lateral surface gradually increases with an increase in optical path length in the linear light guide.

10 Claims, 11 Drawing Sheets

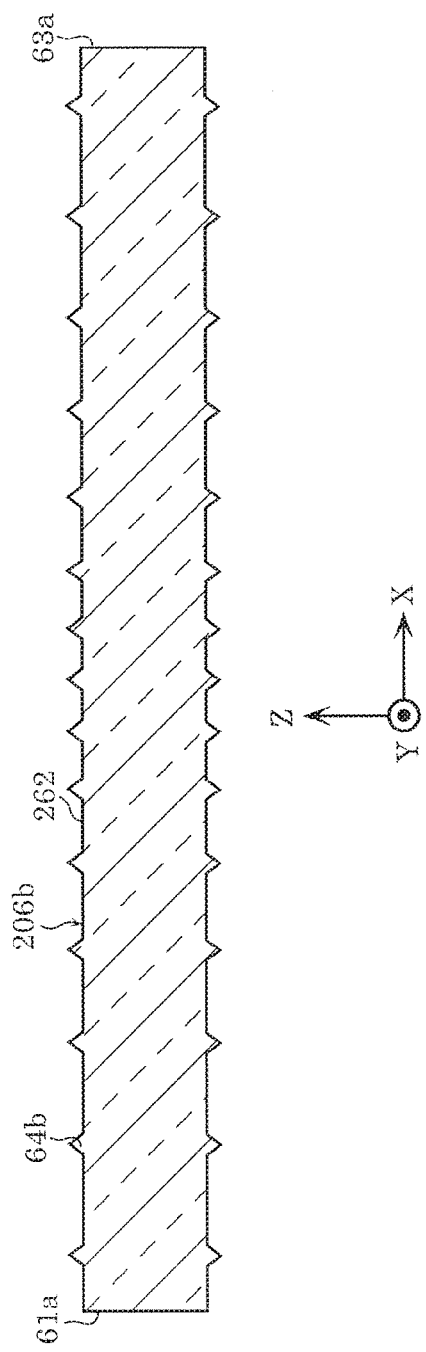

LIGHTING DEVICE

CROSS REFERENCE TO RELATED APPLICATION

This application claims the benefit of priority of Japanese Patent Application Number 2017-184011 filed on Sep. 25, 2017, the entire content of which is hereby incorporated by reference.

BACKGROUND

1. Technical Field

The present disclosure relates to a lighting device.

2. Description of the Related Art

A conventional vehicle lamp that includes a laser light source and a light guide that transmits the laser light emitted by the laser light source is known (for example, see Japanese Unexamined Patent Application Publication No. 2014-17060).

SUMMARY

Typically, the longer the light guide is, the less uniform the emission of light from the light guide is. A lighting device that increases the uniformity of light emitted from the light guide is therefore in demand.

In view of this, the present disclosure has an object to provide a lighting device that can emit highly uniform light.

In order to achieve the object described shove, a linear lighting device according to one aspect of the present disclosure includes: a laser light source that emits laser light; a wavelength converter that converts a wavelength of the laser light and emits wavelength-converted light; and a linear light guide that is elongated and guides the wavelength-converted light emitted by the wavelength converter and introduced through a longitudinal end surface. The linear light guide includes a lateral surface which emits, from the linear light guide, the wavelength-converted light guided by the linear light guide. The proportion of the wavelength-converted light emitted by the lateral surface gradually increases with an increase in optical path length in the linear light guide.

With the present disclosure, it is possible to emit highly uniform light.

BRIEF DESCRIPTION OF DRAWINGS

The figures depict one or more implementations in accordance with the present teaching, by way of examples only, not by way of limitations. In the figures, like reference numerals refer to the same or similar elements.

FIG. 6B illustrates a cross-sectional view of the linear light guide in the linear lighting device according to Embodiment 2;

DETAILED DESCRIPTION OF THE EMBODIMENTS

Figure 1:
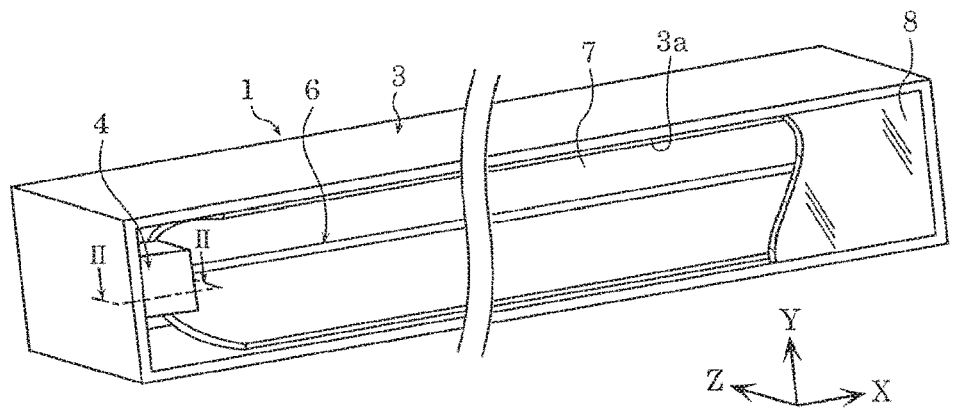
FIG. 1 is a perspective view of a linear lighting device according to Embodiment 1.

The following describes embodiments with reference to the drawings. The embodiments described below each show a preferred, specific example of the present disclosure. The numerical values, shapes, materials, elements, the arrangement and connection of the elements, etc., indicated in the following embodiments are mere examples, and therefore do not intend to limit the present disclosure. Therefore, among elements in the following embodiments, those not recited in any of the broadest, independent claims are described as optional elements.

Moreover, "approximately" means, for example in the case of "approximately the same," not only exactly the same, but what would be recognized as essentially the same as well.

Note that the drawings are represented schematically and are not necessarily precise illustrations. Additionally, like reference signs indicate like elements in the drawings, and repeated descriptions thereof are omitted or simplified.

Hereinafter, embodiments of a linear lighting device according to the present disclosure will be described.

Embodiment 1

(Configuration)

FIG. 1 is a perspective view of linear lighting device 1 according to embodiment 1.

X, Y, and Z directions are shown in FIG. 1. The direction in which laser light source 42 emits light corresponds to the X axis positive direction, the direction toward the upper side of the drawing from linear light guide 6 corresponds to the Y axis positive direction, and the direction pointing toward the ceiling on which linear lighting device 1 is installed corresponds to the Z axis positive direction. The directions shown in FIG. 1 correspond to the directions shown in FIG. 2. This also applies to the drawings subsequent to FIG. 2, excluding the drawings in which the X, Y, and Z directions are not indicated.

As illustrated in FIG. 1, linear lighting device 1 is a line light elongated along the X axis, and is installed on part of a building, such as the ceiling or a wall. Linear lighting device 1 is one example of the lighting device. Linear lighting device 1 includes enclosure 3, light source module 4, linear light guide 6, reflective plate 7, and light-transmissive panel 8.

Enclosure 3 is a box that is elongated along the X axis. Enclosure 3 houses light source module 4, linear light guide 6, reflective plate 7, and light-transmissive panel 8. Enclosure 3 defines opening 3a on its face located in the Z axis negative direction. Wavelength-converted light emitted by linear light guide 6 passes through opening 3a.

Figure 2:
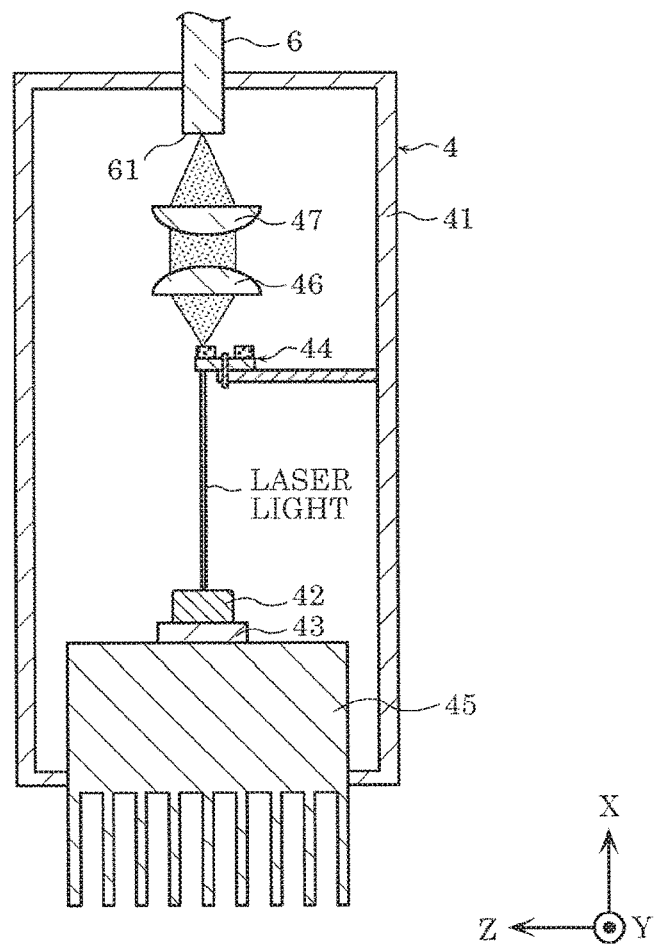
FIG. 2 is an enlarged cross-sectional view taken at line II-II in FIG. 1 that illustrates a light source module in the linear lighting device according to Embodiment 1.

FIG. 2 is an enlarged cross-sectional view taken at line II-II in FIG. 1 that illustrates light source module 4 in linear lighting device 1 according to Embodiment 1.

As illustrated in FIG. 2, light source module 4 is a device that emits laser light. Light source module 4 includes housing 41, laser light source 42, substrate 43 on which laser light source 42 is mounted, phosphor body 44, heat sink 45, first lens 46, and second lens 47.

Housing 41 is a box that houses laser light source 42, substrate 43, phosphor body 44, heat sink 45, first lens 46, second lens 47, and one longitudinal end of linear light guide 6. Inside housing 41, the following components are disposed in the listed order in the X axis positive direction from heat sink 45: substrate 43, laser light source 42, phosphor body 44, first lens 46, second lens 47, and linear light guide 6. Laser light source 42, substrate 43, phosphor body 44, heat sink 45, first lens 46, and second lens 47 are fixed inside housing 41 using a fastener, for example.

Laser light source 42 is a light source that emits laser light. Laser light source 42 emits laser light to entrance surface 61, which is the longitudinal end surface on the X axis negative direction end of linear light guide 6. The laser light is excitation light that excites the phosphor in phosphor body 44. For example, the wavelength of the laser light spans from the blue wavelength band to the violet wavelength band, and can cause phosphor body 44 to emit wavelength-converted light.

Linear lighting device 1 according to this embodiment is an optical system in which laser light emitted by laser light source 42 is converted into wavelength-converted light by phosphor body 44 and then introduced into linear light guide 6. In such an optical system, it is known that the amount referred to as "etendue" is conserved, so long as the light; does not, for example, diffuse. Etendue is defined as the product of the emitting surface area of laser light source 42 and the angle of beam spread of the laser light emitted by laser light source 42. Accordingly, etendue is a measure of the ability of the laser light emitted by laser light source 42 to be introduced through entrance surface 61, that is to say, the magnitude of the ability of linear light guide 6 to take in the light it receives. For example, when the etendue of entrance surface 61 in linear light guide 6 is smaller than the etendue of laser light source 42, linear light guide 6 cannot take in all of the laser light emitted by laser light source 42, resulting in some loss.

Laser light that has a small emitting surface area and is highly directional has a small etendue. Accordingly, by emitting laser light into phosphor body 44, fluorescent light having a small etendue can be emitted from phosphor body 44. It is thus possible to improve the efficiency of the combination of laser light source 42 and linear light guide 6.

The output of laser light from laser light source 42 is controlled by controller. Laser light source 42 may be implemented as a semiconductor laser that emits laser light whose wavelength band ranges from the ultraviolet band to the blue band, i.e., emits light of a wavelength shorter than blue laser light. Laser light source 42 may be also implemented as, for example, an InGaN laser diode or an AlInGaN laser diode.

Note that the laser light emitted by laser light, source 42 may be, for example, light emitted by an LED, so long as the light can excite phosphor. Although a single laser light, source 42 is exemplified as being used, two or more laser light sources 42 may be used.

Phosphor body 44 is disposed between laser light source 42 and linear light guide 6, and converts the wavelength of the laser light so as to emit wavelength-converted light. More specifically, phosphor body 44 is disposed between laser light source 42 and first lens 46. Phosphor body 44 is fixed inside enclosure 3 so as to be on the optical axis of the laser light emitted by laser light source 42.

Phosphor body 44 is, for example, a phosphor wheel. Phosphor body 44 rotates on an axis of rotation that is parallel to the optical axis of the laser light. Phosphor body 44 is rotatably driven by a motor. In this embodiment, phosphor body 44 is approximately perpendicular to the optical axis of the laser light emitted by laser light source 42.

Phosphor body 44 produces wavelength-converted light from the laser light emitted by laser light source 42. More specifically, phosphor body 44 converts the laser light into predetermined wavelength-converted light. Phosphor body 44 includes a phosphor, which is a wavelength converter, that emits wavelength-converted light when irradiated with the laser light. Stated differently, the wavelength-converted light is fluorescent light. The phosphor is, for example, an yttrium aluminum garnet (YAG) or RAM phosphor. The phosphor may be selected according to the type of laser light emitted by laser light source 42. In this embodiment, the laser light introduced into phosphor body 44 produces a white wavelength-converted light.

Phosphor body 44 is made by dispersing fine particles of a predetermined phosphor in a binder, which is a transparent material made of, for example, ceramic or silicone resin. Stated differently, the binder is the medium that holds the phosphor of phosphor body 44. The binder included in phosphor body 44 is not limited to ceramic or silicone resin; other transparent materials may be used for the binder, such as transparent glass.

Note that the phosphor may include, for example, red, green, and blue phosphors, and, as a result of being excited by excitation light, may emit red, green, and blue light. In such cases, the wavelength-converted red, green, and blue light may be mixed to yield white light.

Phosphor body 44 may include a plurality of types of phosphors that absorb part of the blue laser light from laser light source 42 and convert the wavelength of the absorbed light so as to yield green to yellow light. With such a phosphor body 44, for example, when laser light source 42 emits blue laser light, the green to yellow fluorescent light emitted as a result of phosphor body 44 absorbing part of the blue laser light and the blue laser light that passes through the phosphor without being absorbed mix to yield an pseudo-white wavelength-converted light.

Phosphor body 44 is one example of the wavelength converter. Note that a phosphor that is not held by a binder may also be used as the wavelength converter.

Heat sink 45 is a heat dissipating component that dissipates heat generated by laser light source 42. On the X axis negative direction side of heat sink 45, that is to say, on the side opposite laser light source 42, fins are exposed from housing 41.

First lens 46 is a plan-convex lens. First lens 46 is disposed in housing 41 such that the planar surface of first lens 46 is approximately perpendicular to the optical axis of laser light source 42.

Second lens 47 is a plan-convex lens. Second lens 47 is disposed in housing 41 such that the planar surface of second lens 47 is approximately perpendicular to the optical axis of laser light source 42. The convex surface of second lens 47 faces the convex surface of first lens 46, and the planar surface of second lens 47 faces entrance surface 61 of linear light guide 6. First lens 46 and second lens 47 focus wavelength-converted light emitted by phosphor body 44.

Figure 3A:
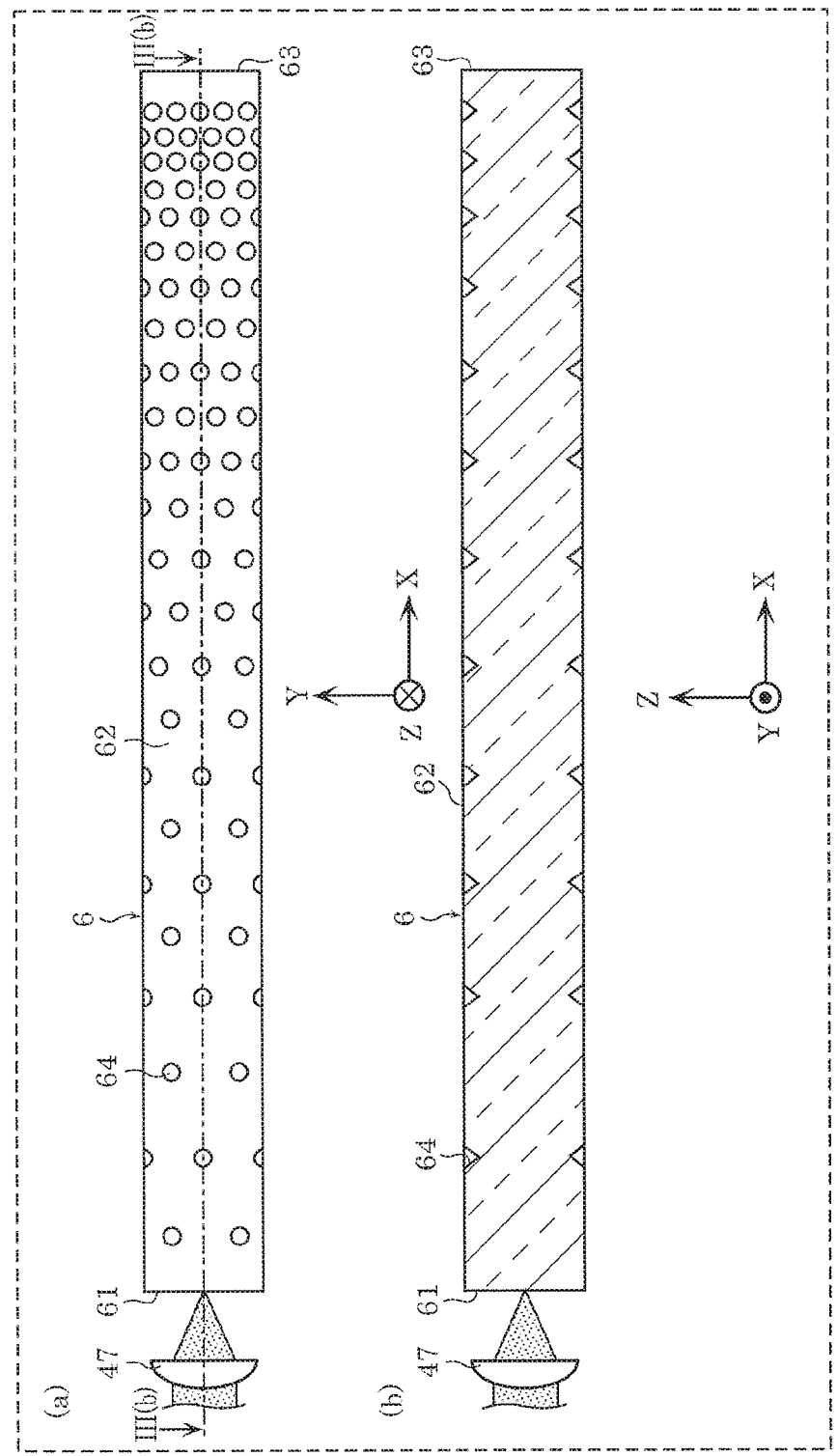
FIG. 3A illustrates a plan view and a cross-sectional view of a linear light guide in the linear lighting device according to Embodiment 1.

FIG. 3A illustrates a plan view and a cross-sectional view of linear light guide 6 in linear lighting device 1 according to Embodiment 1.

As illustrated in FIG. 2 and FIG. 3A, linear light guide 6 is a cylindrical rod-shaped component made of a transparent material, and is, for example, an optical fiber cable. Linear light guide 6 is fixed inside enclosure 3 so as to be approximately parallel to the X axis. The elongated linear light guide 6 receives, through entrance surface 61, which is a longitudinal end surface, wavelength-converted light emitted by phosphor body 44, and guides the received wavelength-converted light. Linear light guide 6 is optically connected to laser light source 42 via an optical lens. Note that the shape of linear light guide 6 is not limited to a cylindrical shape; linear light guide 6 may have any type of columnar shape, such as a polygonal column. In this embodiment, linear light guide 6 has a diameter of approximately 2 mm.

Linear light guide 6 includes entrance surface 61, first emission surface 62, and second emission surface 63.

Entrance surface 61 is a surface through which the wavelength-converted light, having been generated by phosphor body 44 upon receiving the laser light from laser light source 42 and focused by first lens 46 and second lens 47, is introduced. Entrance surface 61 faces second lens 47. Entrance surface 61 also faces laser light source 42 with first lens 46, second lens 47, and phosphor body 44 disposed therebetween.

As illustrated in FIG. 3A, linear light guide 6 includes a light extractor (included in the lateral surface) that emits the guided wavelength-converted light from first emission surface 62 of linear light guide 6. In this embodiment, the light extractor is an uneven surface structure on first emission surface 62 of linear light guide 6. First emission surface 62 is the outer diameter surface of linear light guide 6, that is to say, first emission surface 62 is a lateral surface of linear light guide 6, which is a surface that intersects the radial direction of linear light guide 6. Light that is guided by linear light guide 6 is emitted from first emission surface 62.

Figure 3B:
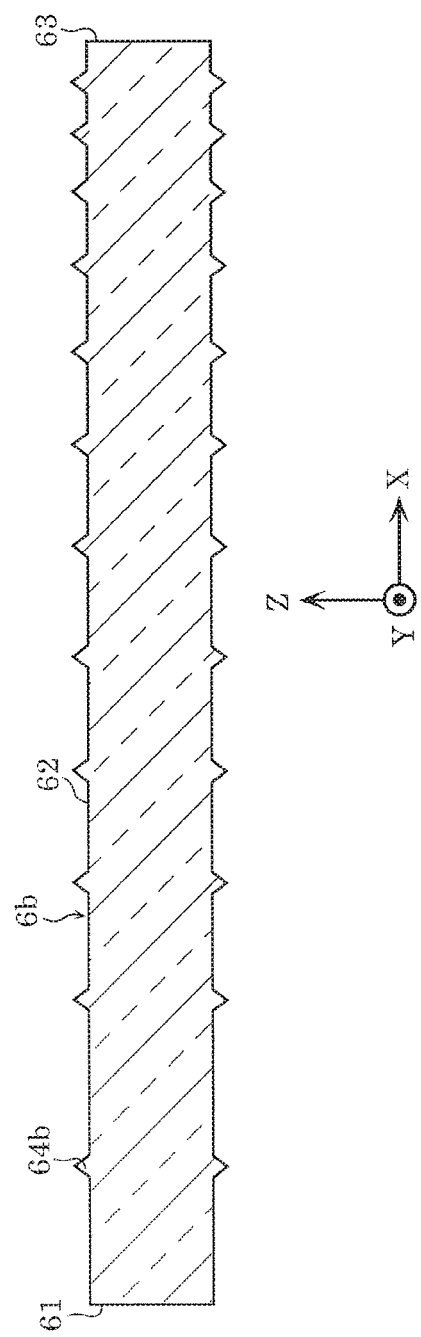
FIG. 3B illustrates a cross-sectional view of the linear light guide in the linear lighting device according to Embodiment 1.

The proportion of the wavelength-converted light emitted by the light extractor gradually increases with an increase in the optical path length in linear light guide 6. The proportion of the wavelength-converted light emitted by the light extractor gradually increases with distance from entrance surface 61. Stated differently, the density of recesses 64 or protrusions in the uneven surface structure, which is the light extractor, gradually increases with distance from entrance surface 61. In this embodiment, a plurality of recesses 64 included in the uneven surface structure are formed in linear light guide G. The density of recesses 64 formed in first emission surface 62 gradually increases with distance from entrance surface 61. Recesses 64 are prisms having any one of the following shapes: a circular cone, a hemisphere, a circular truncated cone, a truncated pyramid, and a pyramid. FIG. 3B illustrates a cross-sectional view of linear light guide 6b in linear lighting device 1 according to Embodiment 1. FIG. 3B illustrates linear light guide 6b including a plurality of protrusions 64b in the uneven surface structure.

Note that, in this embodiment, as illustrated in FIG. 3A, recesses 64 included in the uneven surface structure are formed in first emission surface 62, but protrusions included in the uneven surface structure may be formed on first emission surface 62. Accordingly, the uneven surface structure is not limited to recesses 64. Note that the protrusions included in the uneven surface structure have the inverse structure of recesses 64, and as such, detailed description thereof is omitted.

Here, the proportion of the wavelength-converted light that is emitted from the light extractor is defined as the proportion of the amount of light emitted in the circumferential direction from first emission surface 62 relative to the amount of light guided by linear light guide 6.

Note that the light extractor is not limited to an uneven surface structure, and may be, for example, a light diffuser such as silicone resin or silica. In such cases, the light diffuser may be contained in linear light guide 6, and, alternatively, may be applied to first emission surface 62. The density of the diffuser in linear light guide 6 gradually increases with distance from entrance surface 61.

Note that a light diffusing function may be achieved by printing a pattern of dots onto first emission surface 62 of linear light guide 6.

Second emission surface 63 is located on the opposite end of linear light guide 6 relative to entrance surface 61. Wavelength-converted light guided by linear light guide 6 is emitted from second emission surface 63.

A laser cutter may be used to produce recesses 64 in the base material used for linear light guide 6. The laser cutter includes, for example, a laser emitter, a galvanoscanner, and an ID lens. The laser from the laser emitter is emitted onto the base material used for linear light guide 6 after being reflected by the galvanoscanner and transmitted by the fθ lens. Here, the base material used for the linear light guide 6 is rotated and pushed in the axial direction. This forms recesses 64 in first emission surface 62 of the base material used for linear light guide 6.

As illustrated in FIG. 1, reflective plate 7 is a mirror that reflects the wavelength-converted light emitted by linear light guide 6. Reflective plate 7 is curved so as to bow in the Z axis positive direction. This allows reflective plate 7 to reflect and emit the wavelength-converted light from linear light guide 6 in the Z axis negative direction. The wavelength-converted light emitted by linear light guide 6 is light that illuminates the surrounding area. Note that reflective plate 7 is not limited to a plate material; reflective plate 7 may be a reflective film. In other words, reflective plate 7 is one example of the reflector.

Light-transmissive panel 8 covers opening 3a of enclosure 3. Wavelength-converted light emitted by linear light guide 6 passes through light-transmissive panel 8. Light-transmissive panel 8 is made of a transparent material such as acrylic or glass.

In linear lighting device 1 configured as described above, the laser light emitted by laser light source 42 is introduced into phosphor body 44. The phosphor in phosphor body 44 converts the wavelength of the laser light to produce wavelength-converted light. The wavelength-converted light emitted by phosphor body 44 is focused by first lens 46 and second lens 47 and subsequently enters linear light guide 6 through entrance surface 61. The wavelength-converted light is emitted from recesses 64 in first emission surface 62 as it is guided by linear light guide 6. The density of recesses 64 or protrusions in the uneven surface structure gradually increases on first emission surface 62 with distance from entrance surface 61. Accordingly, the greater the distance from entrance surface 61, the greater the proportion of the guided wavelength-converted light extracted by linear light guide 6 is. This makes it easy to emit uniform wavelength-converted light characterized by a reduced unevenness in luminance from first emission surface 62.

(Operational Advantages)

Next, operational advantages of linear lighting device 1 according to this embodiment will be described.

As described above, linear lighting device 1 according to this embodiment is elongated. Linear lighting device 1 includes laser light source 42 that emits laser light, phosphor body 44 that converts the wavelength of the laser light and emits wavelength-converted light, and linear light guide 6 that is elongated and guides the wavelength-converted light emitted by phosphor body 44 and introduced through entrance surface 61. Linear light guide 6 includes a light extractor that emits the guided wavelength-converted light from first emission surface 62 of linear light guide 6. The proportion of the wavelength-converted light emitted by the light extractor gradually increases with an increase in optical path length in linear light guide 6.

With this, the proportion of the wavelength-converted light emitted by the light extractor gradually increases with an increase in the optical path length in linear light guide 6. This makes it possible to extract a significant amount of the wavelength-converted light from first emission surface 62 in locations distanced from entrance surface 61. This allows for emission of uniform wavelength-converted light characterized by a reduced unevenness in luminance from first emission surface 62, that is, this makes it easy to emit light from first emission surface 62.

Accordingly, with linear lighting device 1, it is possible emit highly uniform light.

In linear lighting device 1 according to this embodiment, the light extractor is an uneven surface structure defined by recesses 64 in or protrusions on first emission surface 62 of linear light guide 6. The density of recesses 64 or the protrusions of the uneven surface structure gradually increases with distance from entrance surface 61.

In this way, the density of recesses 64 or protrusions in the uneven surface structure gradually increases with distance from entrance surface 61. This makes it possible to extract a significant amount of the wavelength-converted light from recesses 64 or protrusions in locations distanced from entrance surface 61. This makes it easy to emit uniform wavelength-converted light characterized by a reduced unevenness in luminance from first emission surface 62.

In linear lighting device 1 according to this embodiment, the light extractor is an uneven surface structure defined recesses 64 in or protrusions on the lateral surface of linear light guide 6. Recesses 64 or the protrusions in the uneven surface structure are prisms having any one of the following shapes: a circular cone, a semi-sphere, a circular truncated cone, a truncated pyramid, and a pyramid.

In linear lighting device 1 according to this embodiment, the light extractor is an uneven surface structure defined by recesses 64 in or protrusions on the lateral surface of linear light guide 6. In a plan view of recesses or the protrusions in the uneven surface structure, each of the recesses 64 or the protrusions has approximately the same inner diameter or outer diameter, respectively.

Linear lighting device 1 according to this embodiment further includes reflective plate 7 that reflects the wavelength-converted light emitted by linear light guide 6; light-transmissive panel 8 that transmits the wavelength-converted light; and enclosure 3 that houses laser light source 42, fluorescent body 44, linear light guide 6, and reflective plate 7, and holds light-transmissive panel 8 in opening 3a through which the wavelength-converted light passes. Reflective plate 7 is oriented in enclosure 3 to reflect the wavelength-converted light toward opening 3a.

Linear lighting device 1 according to this embodiment is elongated. Linear lighting device 1 includes laser light source 42 that emits laser light, phosphor body 44 that converts the wavelength of the laser light and emits wavelength-converted light, and linear light guide 6 that is elongated and guides the wavelength-converted light emitted by phosphor body 44 and introduced through entrance surface 61. Linear light guide 6 includes a lateral surface that emits the guided wavelength-converted light from linear light guide 6. The proportion of the wavelength-converted light emitted by the lateral surface gradually increases with an increase in optical path length in linear light guide 6.

Variation of Embodiment 1

Figure 4A:
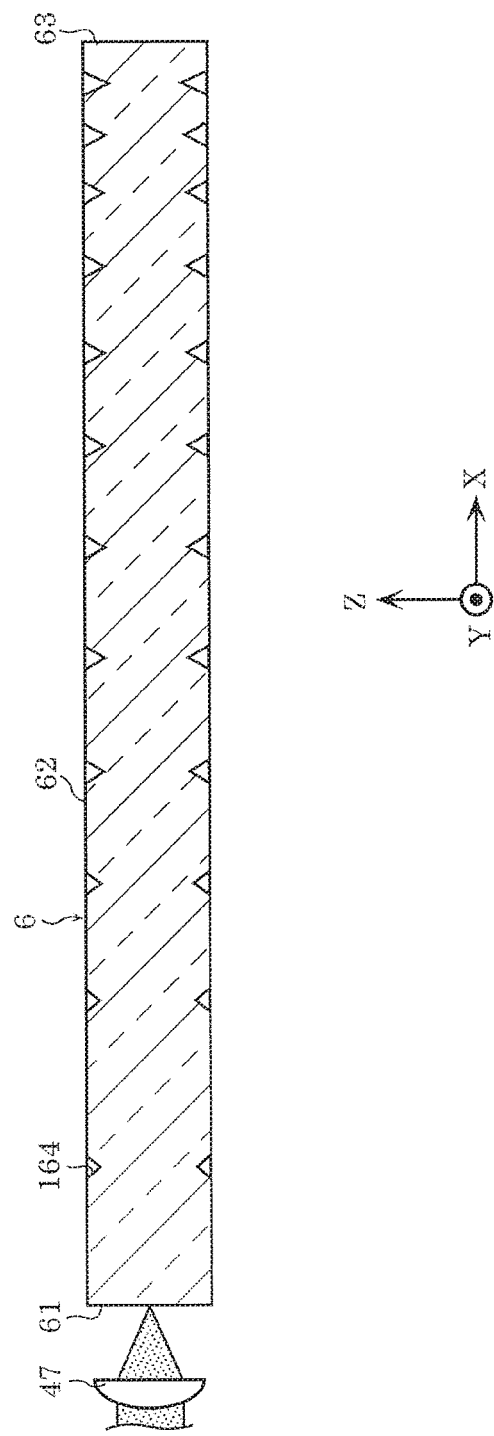
FIG. 4A illustrates a cross-sectional view of a linear light guide in a linear lighting device according to a variation of Embodiment 1.

FIG. 4A illustrates a cross-sectional view of linear light guide 6 in linear lighting device 1 according to a variation of Embodiment 1.

In this variation, recesses 164 differ from the recesses according to Embodiment 1 in that they vary in depth. Moreover, unless otherwise stated, linear lighting device 1 according to this variation has the same configuration as Embodiment 1. Accordingly, like elements share like reference signs in the drawings, and repeated detailed description of those elements are omitted.

As illustrated in FIG. 4A, a plurality of recesses 164 are formed in first emission surface 62 of linear light guide 6. Recesses 164 or the protrusions of the uneven surface structure gradually increase in depth or height, respectively, with distance from entrance surface 61. In this embodiment, recesses 164 are used. More specifically, each recess 164 has the same diameter, but the depth of recesses 164 gradually increases with distance from entrance surface 61.

With this configuration, in linear lighting device 1 according to this embodiment, the light extractor is an uneven surface structure defined by a plurality of recesses 164 in or protrusions on first emission surface 62 of linear light guide 6. Recesses 164 or the protrusions of the uneven surface structure gradually increase in depth or height, respectively, with distance from the longitudinal end surface.

Figure 4B:
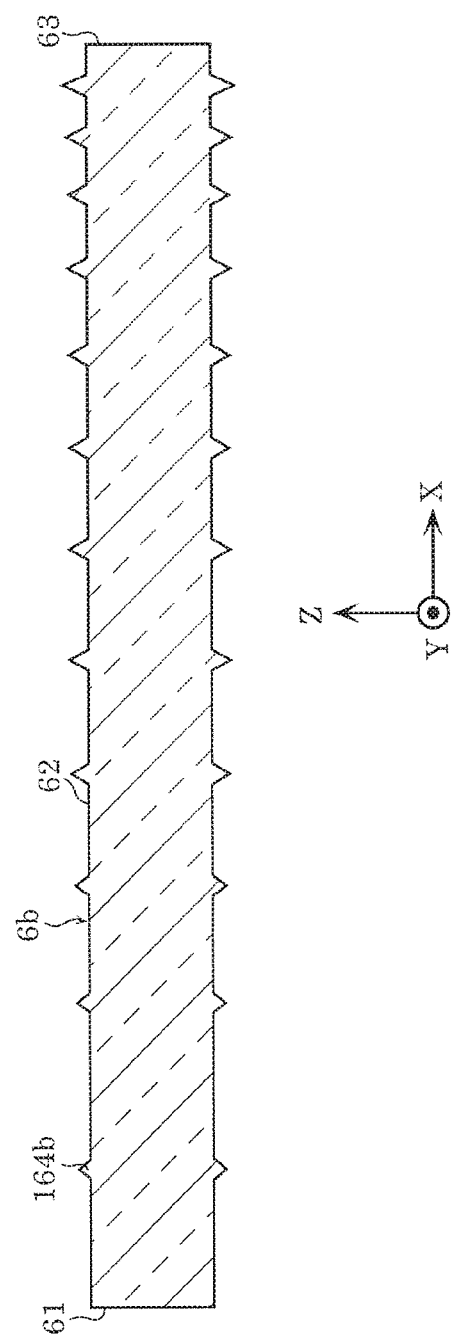
FIG. 4B illustrates a cross-sectional view of a linear light guide in a linear lighting device according to a variation of Embodiment 1.

In this way, recesses 164 or the protrusions gradually increase in depth or height, respectively, with distance from entrance surface 61. This makes it possible to extract a significant amount of the wavelength-converted light from recesses 164 or protrusions in locations distanced from entrance surface 61. This makes it easy to emit uniform wavelength-converted light characterized by a reduced unevenness in luminance from first emission surface 62. FIG. 4B illustrates a cross-sectional view of linear light guide 6b in linear lighting device 1 according to a variation of Embodiment 1. FIG. 4B illustrates linear light guide 6b including a plurality of protrusions 164b in the uneven surface structure.

These variations also achieve other operational advantages achieved by Embodiment 1.

Embodiment 2

Figure 5:
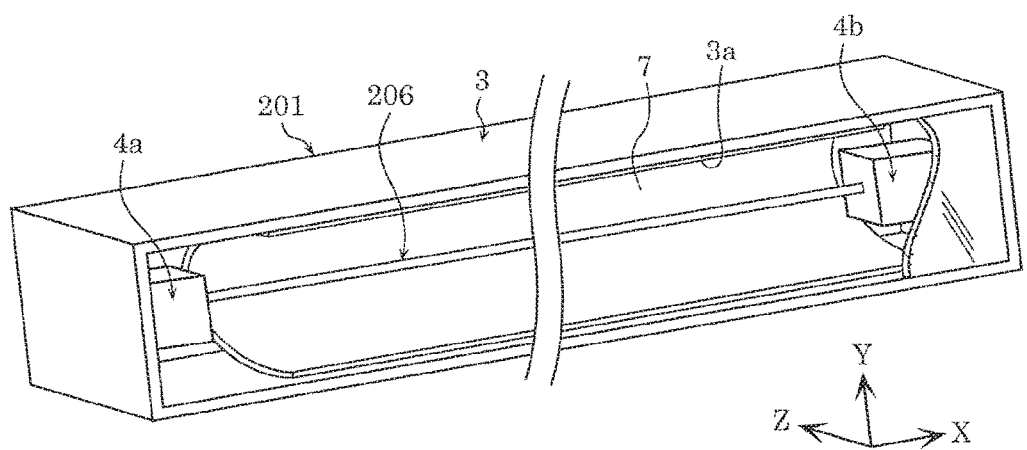
FIG. 5 is a perspective view of a linear lighting device according to Embodiment 2.
Figure 6A:
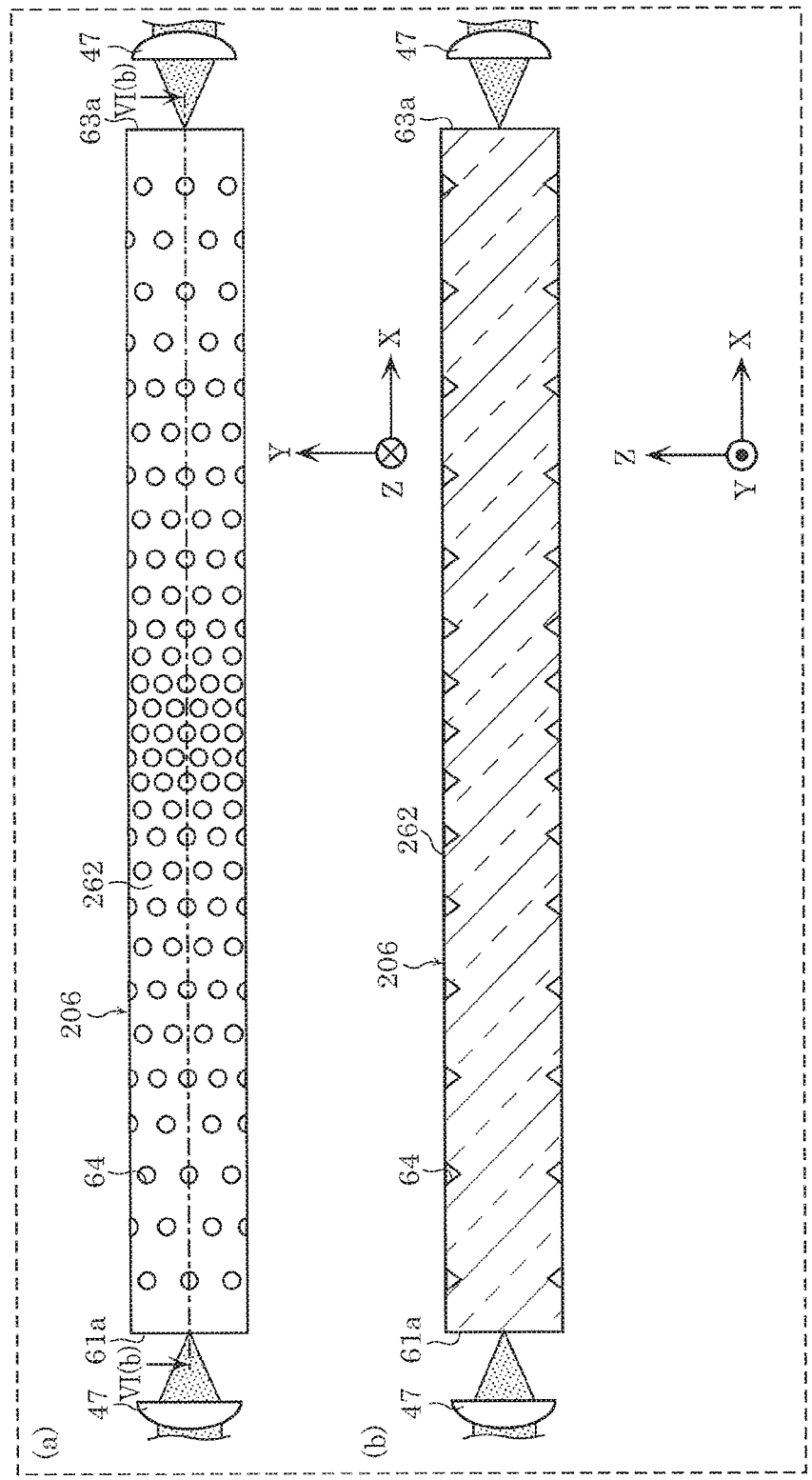
FIG. 6A illustrates a plan view and a cross-sectional view of a linear light guide in the linear lighting device according to Embodiment 2.

FIG. 5 is a perspective view of linear lighting device 201 according to Embodiment 2. FIG. 6A illustrates a plan view and a cross-sectional view of linear light guide 206 in linear lighting device 201 according to Embodiment 2.

This embodiment differs from Embodiment 1 in that laser light from laser light sources 42 disposed at both longitudinal ends of linear light guide 206 is introduced into linear light guide 206. Accordingly, second emission surface 63 according to Embodiment 1 corresponds to second entrance surface 63a according to this embodiment, and first emission surface 62 according to Embodiment 1 corresponds to emission surface 262 according to this embodiment.

Moreover, unless otherwise stated, linear lighting device 201 according to this embodiment has the same configuration as Embodiment 1 and the variations thereof. Accordingly, like elements share like reference signs in the drawings, and repeated detailed description of those elements are omitted.

As illustrated in FIG. 6A, linear lighting device 201 includes first light source module 4a and second light source module 4b. First light source module 4a and second light source, module 4b have the same configuration. FIG. 6B illustrates a cross-sectional view of linear light guide 206b in linear lighting device 201 according to Embodiment 2. FIG. 6B illustrates linear light guide 206b including a plurality of protrusions 64b in the uneven surface structure.

As illustrated in FIG. 6A, phosphor body 44 includes a first phosphor body disposed between the first laser light source and linear light guide 206, and a second phosphor body disposed between the second laser light source and linear light guide 206.

First light source module 4a is disposed on one side of linear light guide 206, which is the side in the X axis negative direction. Second light source module 4b is disposed on a second side of linear light guide 206, which is the side in the X axis positive direction. In other words, first light source module 4a and second light source module 4b are respectively disposed at the two longitudinal ends of linear light guide 206.

The wavelength of the laser light emitted by the first laser light source in first light source module 4a is converted by the first phosphor body. This first wavelength-converted light enters linear light guide 206 through first entrance surface 61a, which is the longitudinal end surface in the X axis negative direction. The wavelength of the laser light emitted by the second laser light source in second light source module 4b is converted by the second phosphor body. This second wavelength-converted light enters linear light guide 206 through second entrance surface 63a, which is the longitudinal end surface in the X axis positive direction.

The density of recesses 64 or protrusions in the uneven surface structure of linear light guide 206 gradually increases with distance from first entrance surface 61a to the central region of linear light guide 206 and from second entrance surface 63a to the central region of linear light guide 206.

Linear light guide 206 it optically connected to first light source module 4a and second light source module 4b. Linear light guide 206 includes, in addition to first entrance surface 61a, emission surface 262 and second entrance surface 63a.

Emission surface 262 is the outer diameter surface of linear light guide 206, and intersects the radial direction of linear light guide 206. Light that is guided by linear light guide 206 is emitted from emission surface 262.

Second entrance surface 63a is the surface through which light emitted by laser light source 42 in second light source module 4b is introduced into linear light guide 206.

Second entrance surface 63a is the longitudinal end surface located on the X axis positive direction end of linear light guide 206, which is on the opposite end of linear light guide 206 relative to first entrance surface 61a.

(Test Results)

Figure 7:
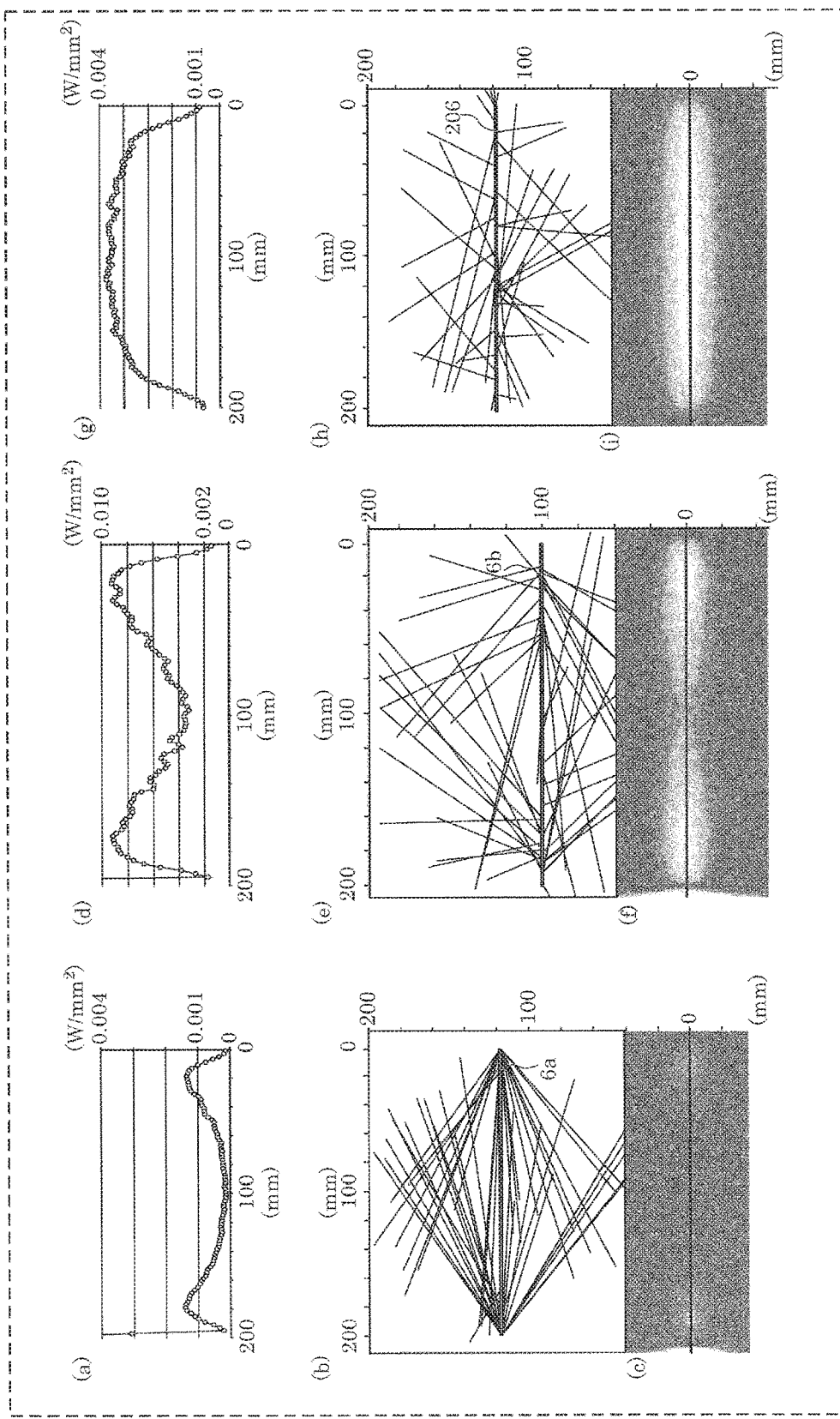
FIG. 7 illustrates light emitted from linear light guides in linear lighting devices.

FIG. 7 illustrates light emitted from linear light guides in linear lighting devices. In FIG. 7, laser light sources 42 are disposed at both longitudinal ends of each linear light guide, just as in this embodiment. A 200 mm long light, guide made of acrylic having a refractive index of n=1.49 was used for each of linear light guides.

In FIG. 7, (a) illustrates a graph of the luminance of light emitted from the Y axis positive direction surface of linear light guide 6a, in which no recesses 64 are formed, (b) illustrates the direction in which light is emitted from the lateral surface of linear light guide 6a, in which no recesses 64 are formed, and (c) illustrates the distribution of luminance for linear light guide 6a, in which no recesses 64 are formed.

As shown by (a) through (c) in FIG. 7, when no recesses 64 are formed in linear light guide 6a, light is disproportionately emitted in the vicinity of laser light sources 42, and luminance decreases with distance from the entrance surfaces. This shows that with such a linear light guide 6a, the brightness of light emitted from the emission surface is uneven.

In FIG. 7, (d) illustrates a graph of the luminance of light emitted from the Y axis positive direction surface of linear light guide 6b, in which evenly spaced recesses 64 are formed, (e) illustrates the direction in which light is emitted from the lateral surface of linear light, guide 6b, in which evenly spaced recesses 64 are formed, and (f) illustrates the distribution of luminance for linear light guide 6b, in which evenly spaced recesses 64 are formed. In (d) through (f) in FIG. 7, recesses 64 are spaced apart by approximately 2 mm.

As shown by (d) through (f) in FIG. 7, when evenly spaced recesses 64 are formed in linear light guide 6b, light is disproportionately emitted in the vicinity of laser light sources 42, and luminance decreases with distance from the entrance surfaces. With linear light guide 6b configured as described above, compared to linear light guide 6a corresponding to (a) through (c) in FIG. 7, luminance is more uniform, but luminance is low in the central region of linear light guide 6b, resulting in an unevenness in brightness of the light emitted from the emission surface.

In FIG. 7, (g) illustrates a graph of the luminance of light emitted from the Y axis positive direction surface of linear light guide 206 according to this embodiment, (h) illustrates the direction in which light is emitted from the lateral surface of linear light guide 206 according to this embodiment, and (i) illustrates the distribution of luminance for linear light guide 206 according to this embodiment.

As shown by (g) through (i) in FIG. 7, in the case of linear light guide 206 according to this embodiment, luminance does not decrease even in locations distanced from first entrance surface 61a. Compared to linear light guides 6a and 6b corresponding to (a) through (f) in FIG. 7, it can be seen that linear light guide 206 configured as described above produces a more uniform luminance. Accordingly, as illustrated in (g) through. (i) in FIG. 7, linear light guide 206 according to this embodiment achieved a superior result compared to linear light guides 6a and 6b corresponding to (a) through (f) in FIG. 7.

(Operational Advantages)

Next, operational advantages of linear lighting device 201 according to this embodiment will be described.

As described above, in linear lighting device 201 according to this embodiment, laser light source 42 includes a first laser light source disposed on a first side of linear light guide 206 and a second laser light source disposed on a second side of linear light guide 206. The phosphor body includes a first phosphor body disposed between the first laser light source and linear light guide 206, and a second phosphor body disposed between the second laser light source and linear light guide 206. The first wavelength-converted light emitted by the first phosphor body enters linear light guide 206 through first entrance surface 61a, which is a first longitudinal end surface. The second wavelength-converted light emitted by the second phosphor body enters linear light guide 206 through second entrance surface 63a, which is a second longitudinal end surface.

With this, laser light sources 42 are disposed at both longitudinal ends of linear light guide 206, and light enters linear light guide 206 through both longitudinal ends. This makes it possible to extract a significant amount of light even in the central region of linear light guide 206 distanced from laser light sources 42 since light is guided to the central region of linear light guide 206 from both longitudinal ends. This makes it easy to omit uniform wavelength-converted light characterized by a reduced unevenness in luminance from emission surface 262.

In linear lighting device 201 according to this embodiment, the light extractor is an uneven surface structure defined by recesses 64 or protrusions in or on emission surface 262 of linear light guide 206. The density of recesses 64 or protrusions in the uneven surface structure gradually increases with distance from first entrance surface 61a to the central region of linear light guide 206 and from second entrance surface 63a to the central region of linear light guide 206.

With this, the density of recesses 64 or protrusions in the uneven surface structure gradually increases with distance from first entrance surface 61a to the central region of linear light guide 206 and from second entrance surface 63a to the central region of linear light guide 206. This makes it possible to extract a significant amount of light even in the central region of linear light guide 206 distanced from laser light sources 42 since light is guided to the central region of linear light guide 206 from both longitudinal ends. This makes it easy to emit even more uniform wavelength-converted light characterized by a reduced unevenness in luminance from emission surface 262.

This embodiment also achieves other operational advantages achieved by Embodiment 1.

Variation of Embodiment 2

Figure 8A:
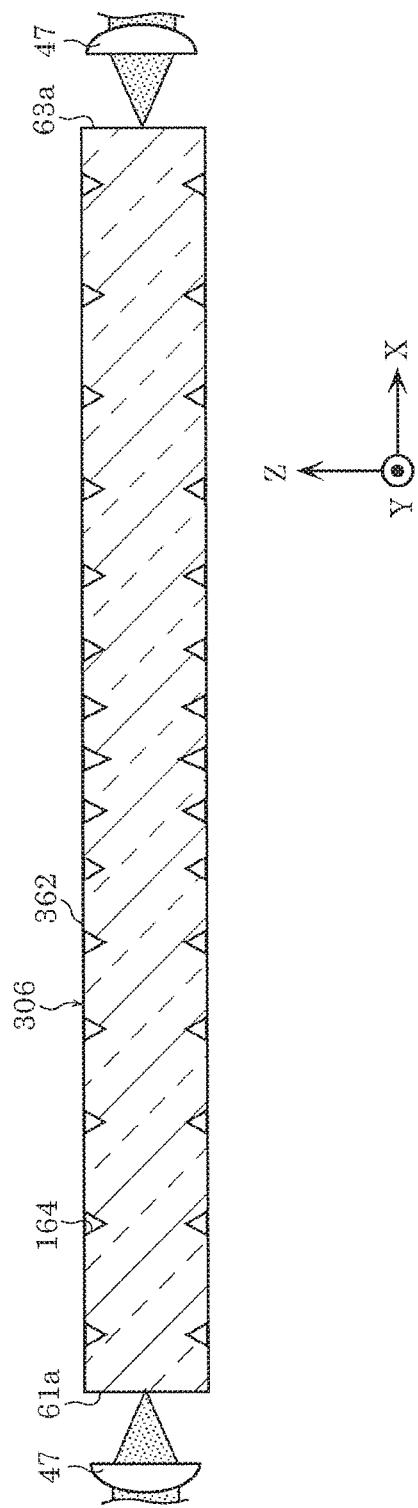
FIG. 8A illustrates a cross-sectional view of a linear light guide in a linear lighting device according to a variation of Embodiment 2.

FIG. 8A illustrates a cross-sectional view of linear light guide 306 in linear lighting device 201 according to a variation of Embodiment 2.

In this variation, recesses 164 or protrusions differ from Embodiment 1 in that they vary in depth or height, respectively. Moreover, unless otherwise stated, linear lighting device 201 according to this variation has the same configuration as Embodiment 2. Accordingly, like elements share like reference signs in the drawings, and repeated detailed description of those elements are omitted.

As illustrated in FIG. 8A, a plurality of recesses 164 are formed in emission surface 362 of linear light guide 306. Recesses 164 or protrusions in the uneven surface structure gradually increase in depth or height, respectively, with distance from first entrance surface 61a to the central region of linear light guide 306 and from second entrance surface 63a to the central region of linear light guide 306. Each recess 164 has the same diameter.

Figure 8B:
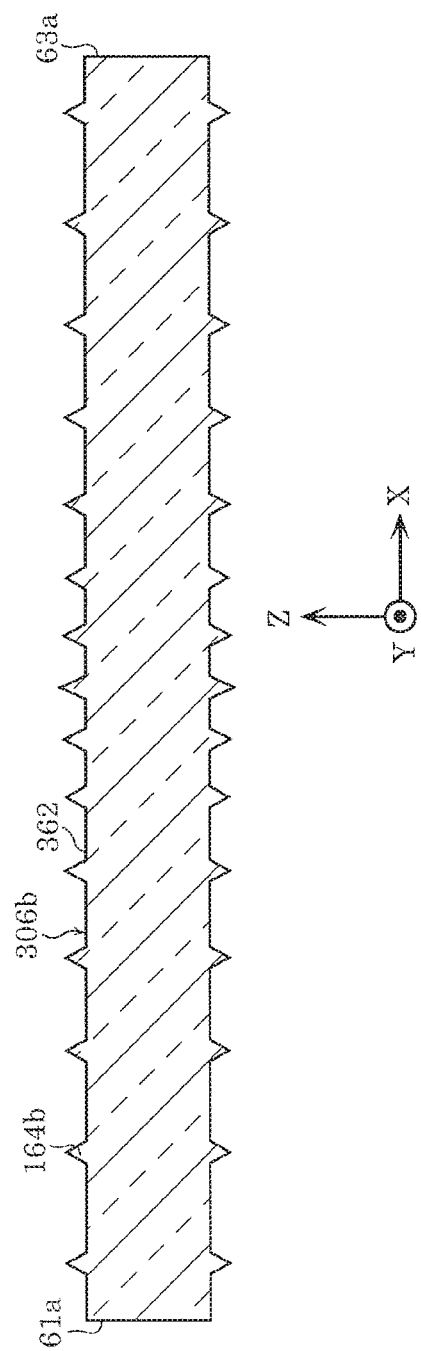
FIG. 8B illustrates a cross-sectional view of a linear light guide in a linear lighting device according to a variation of Embodiment 2.

With this configuration, in linear lighting device 201 according to this variation, the light extractor is an uneven surface structure defined by a plurality of recesses 164 in or protrusions on first emission surface 362 of linear light guide 306. Recesses 164 or protrusions in the uneven surface structure gradually increase in depth or height, respectively, with distance from first entrance surface 61a to the central region of linear light guide 306 and from second entrance surface 63a to the central region of linear light guide 306. FIG. 8B illustrates a cross-sectional view of linear light guide 306 in linear lighting device 201 according to a variation of Embodiment 2. FIG. 8B illustrates linear light guide 306b including a plurality of protrusions 164b in the uneven surface structure.

As illustrated in FIG. 8A, recesses 164 or the protrusions gradually increase in depth or height, respectively, with distance from entrance surface 61. This makes it possible to extract a significant amount of light even in the central region of linear light guide 306 distanced from laser light sources 42 since light is guided to the central region of linear light guide 206 from both longitudinal ends. This makes it easy to emit even more uniform wavelength-converted light characterized by a reduced unevenness in luminance from emission surface 362.

These variations also achieve other operational advantages achieved by Embodiment 2.

(Other Variations, etc.)

Hereinbefore, the present disclosure has been described based on Embodiments 1 and 2 and variations of Embodiments 1 and 2, but the present disclosure is not limited to Embodiments 1 and 2 and the variations of Embodiments 1 and 2 described above.

For example, a reflective component that reflects light may be disposed on the first emission surface in linear light guide according to Embodiments 1 and 2 and variations of Embodiments 1 and 2. This reflective component may be made of metal or, for example, an opaque white resin such as polybutylene terephthalate.

The linear lighting device according to Embodiments 1 and 2 and variations of Embodiments 1 and 2 may be flexible. For example, the linear light guide, enclosure, reflective plate, light-transmissive panel may be flexible.

Embodiments arrived at by a person skilled in the art making various modifications to any one of Embodiments 1 and 2 and the variations of Embodiments 1 and 2 as well as embodiments realized by arbitrarily combining structural components and functions in Embodiments 1 and 2 and the variations of Embodiments 1 and 2 which do not depart from the essence of the present disclosure are included in the present disclosure.

What is claimed is:

1. A lighting device, comprising:
   a laser light source that emits laser light;
   a wavelength converter that converts a wavelength of the laser light and emits wavelength-converted light; and
   a linear light guide that is elongated and guides the wavelength-converted light emitted by the wavelength converter and introduced through a longitudinal end surface,
   wherein the linear light guide includes a lateral surface which emits, from the linear light guide, the wavelength-converted light guided by the linear light guide, and
   a proportion of the wavelength-converted light emitted by the lateral surface gradually increases with an increase in optical path length in the linear light guide.

2. The lighting device according to claim 1, wherein the lateral surface comprises an uneven surface structure defined by recesses in or protrusions on the lateral surface of the linear light guide, and a density of the recesses or the protrusions of the uneven surface structure gradually increases with distance from the longitudinal end surface.

3. The lighting device according to claim 1, wherein the lateral surface comprises an uneven surface structure defined by recesses in or protrusions on the lateral surface of the linear light guide, and the recesses or the protrusions of the uneven surface structure gradually increase in depth or height with distance from the longitudinal end surface.

4. The lighting device according to claim 1, wherein the laser light source includes a first laser light source disposed on a first side of the linear light guide and a second laser light source disposed on a second side of the linear light guide, the wavelength converter includes a first wavelength converter disposed between the first laser light source and the linear light guide, and a second wavelength converter disposed between the second laser light source and the linear light guide, first wavelength-converted light emitted by the first wavelength converter enters the linear light guide through a first longitudinal end surface, and second wavelength-converted light emitted by the second wavelength converter enters the linear light guide through a second longitudinal end surface.

5. The lighting device according to claim 4, wherein the lateral surface comprises an uneven surface structure defined by recesses in or protrusions on the lateral surface of the linear light guide, and a density of the recesses or the protrusions in the uneven surface structure gradually increases from the first longitudinal end surface to a central region of the linear light guide and from the second longitudinal end surface to the central region.

6. The lighting device according to claim 4, wherein the lateral surface comprises an uneven surface structure defined by recesses in or protrusions on the lateral surface of the linear light guide, and the recesses or the protrusions in the uneven surface structure gradually increase in depth or height from the first longitudinal end surface to a central region of the linear light guide and from the second longitudinal end surface to the central region.

7. The lighting device according to claim 1, wherein the lateral surface comprises an uneven surface structure defined by recesses in or protrusions on the lateral surface of the linear light guide, and the recesses or the protrusions in the uneven surface structure are prisms each having any one of the following shapes: a circular cone, a hemisphere, a circular truncated cone, a truncated pyramid, and a pyramid.

8. The lighting device according to claim 1, wherein the lateral surface comprises an uneven surface structure defined by recesses in or protrusions on the lateral surface of the linear light guide, and in a plan view of the recesses or the protrusions in the uneven surface structure, each of the recesses or the protrusions has approximately a same inner diameter or outer diameter.

9. The lighting device according to claim 1, further comprising:

a reflector that reflects the wavelength-converted light emitted by the linear light guide;

a light-transmissive panel that transmits the wavelength-converted light; and an enclosure that houses the laser light source, the wavelength converter, the linear light guide, and the reflector, and includes the light-transmissive panel in an opening through which the wavelength-converted light passes, wherein the reflector is oriented in the enclosure to reflect the wavelength-converted light toward the opening.

10. A lighting device, comprising:

a laser light source that emits laser light;

a wavelength converter that converts a wavelength of the laser light and emits wavelength-converted light; and a linear light guide that is elongated and guides the wavelength-converted light emitted by the wavelength converter and introduced through a longitudinal end surface, wherein the linear light guide includes a light extractor which emits, from a lateral surface of the linear light guide, the wavelength-converted light guided by the linear light guide, and a proportion of the wavelength-converted light emitted by the light extractor gradually increases with an increase in optical path length in the linear light guide.

* * * * *